US011121083B2

(12) United States Patent
Huang

(10) Patent No.: US 11,121,083 B2
(45) Date of Patent: Sep. 14, 2021

(54) SEMICONDUCTOR DEVICE WITH FUSE-DETECTING STRUCTURE

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/433,813

(22) Filed: Jun. 6, 2019

(65) Prior Publication Data
US 2020/0388571 A1 Dec. 10, 2020

(51) Int. Cl.
*H01L 23/525* (2006.01)
*G01R 31/74* (2020.01)

(52) U.S. Cl.
CPC .......... *H01L 23/5256* (2013.01); *G01R 31/74* (2020.01)

(58) Field of Classification Search
CPC ... H01L 23/525; H01L 23/5256; H01L 23/62; G01R 31/74
See application file for complete search history.

(56) References Cited

U.S. PATENT DOCUMENTS

| 2006/0163571 A1* | 7/2006 | Lim | H01L 21/8221 257/48 |
| 2013/0130415 A1* | 5/2013 | Ahn | H01L 22/34 438/18 |
| 2014/0264505 A1* | 9/2014 | Chiu | H01L 27/14685 257/292 |

FOREIGN PATENT DOCUMENTS

TW 201023344 A1 6/2010

OTHER PUBLICATIONS

Office Action dated Jun. 2, 2020 related to Taiwanese Application No. 108127042.

* cited by examiner

*Primary Examiner* — Matthew E. Gordon
(74) *Attorney, Agent, or Firm* — Muncy, Geissler, Olds & Lowe, P.C.

(57) ABSTRACT

A semiconductor device includes a substrate; an insulating layer positioned above the substrate, wherein the insulating layer has two ends; a first doped region formed in the substrate and positioned at one end of the two ends of the insulating layer; a second doped region formed in the substrate and positioned at the other end of the two ends of the insulating layer, wherein the second doped region is opposite to the first doped region; a control terminal positioned above the insulating layer; a first fuse head positioned above the control terminal and electrically coupled to the first doped region; a second fuse head positioned above the first fuse head; and a fuse area positioned between the first fuse head and the second fuse head.

6 Claims, 4 Drawing Sheets

SEMICONDUCTOR DEVICE WITH FUSE-DETECTING STRUCTURE

TECHNICAL FIELD

The present disclosure relates to a semiconductor device with a fuse-detecting structure, and more particularly, to a semiconductor device with a detecting structure for detecting the status of the fuse.

DISCUSSION OF THE BACKGROUND

Semiconductor devices often include programmable fuses such as laser fuses or e-fuses (electronic fuses) for storing information such as chip ID, configuration information, electrical test data, etc. Programmable fuses also can be used to implement redundancy, e.g. in the case of an integrated processor cache or memory device.

A fuse on a semiconductor wafer or die is programmed by removal of fuse metal, often referred to as fuse blow, e.g. by laser cutting or forcing a high current through the fuse element. In the case of laser fuses, a high energy laser is used to evaporate metal (e.g. Al, Cu, etc.) and create a crater or cavity which interrupts the fuse being programmed. By evaporating the fuse metal, the electrical connection between opposing heads of the fuse is broken. The state of the fuses is typically verified after programming and before dicing of the wafer into individual dies.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a fuse and a transistor. The fuse includes a first fuse head, a second fuse head, and a fuse area positioned between the first fuse head and the second fuse head. The transistor is electrically coupled to the first fuse head. The first fuse head, the second fuse head, the fuse area, and the transistor together form a detecting structure for detecting a status of the fuse.

Another aspect of the present disclosure provides a semiconductor device including a substrate; an insulating layer positioned above the substrate, wherein the insulating layer has two ends; a first doped region formed in the substrate and positioned at one end of the two ends of the insulating layer; a second doped region formed in the substrate and positioned at the other end of the two ends of the insulating layer, wherein the second doped region is opposite to the first doped region; a control terminal positioned above the insulating layer; a first fuse head positioned above the control terminal and electrically coupled to the first doped region; a second fuse head positioned above the first fuse head; and a fuse area positioned between the first fuse head and the second fuse head.

Another aspect of the present disclosure provides a semiconductor device including a substrate; an insulating layer positioned above the substrate, wherein the insulating layer has two ends; a first doped region formed in the substrate and positioned at one end of the two ends of the insulating layer; a second doped region formed in the substrate and positioned at the other end of the two ends of the insulating layer, wherein the second doped region is opposite to the first doped region; a control terminal positioned above the insulating layer; a first fuse head positioned above the control terminal and electrically coupled to the control terminal; a second fuse head positioned above the first fuse head; and a fuse area positioned between the first fuse head and the second fuse head.

Due to the design of the semiconductor device, it is possible to detect the status (e.g., temperature, resistance) of the fuse electrically, and the efficiency of manufacturing the semiconductor device may be thereby improved. In addition, the electrical fuse-detecting capacity of the semiconductor device may also be used to detect latent damage which is difficult to detect by visual inspection.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor device with a detecting structure for detecting the status (e.g., temperature, resistance) of the fuse. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure are described in detail below. However, in addition to the detailed description, the present disclosure may also be widely implemented in other embodiments. The scope of the present disclosure is not limited to the detailed description, but is defined by the claims.

Note that, in the description of the present disclosure, above (or up) corresponds to the direction of the arrow of the direction Z, and below (or down) corresponds to the opposite direction of the arrow of the direction Z.

Figure 1:
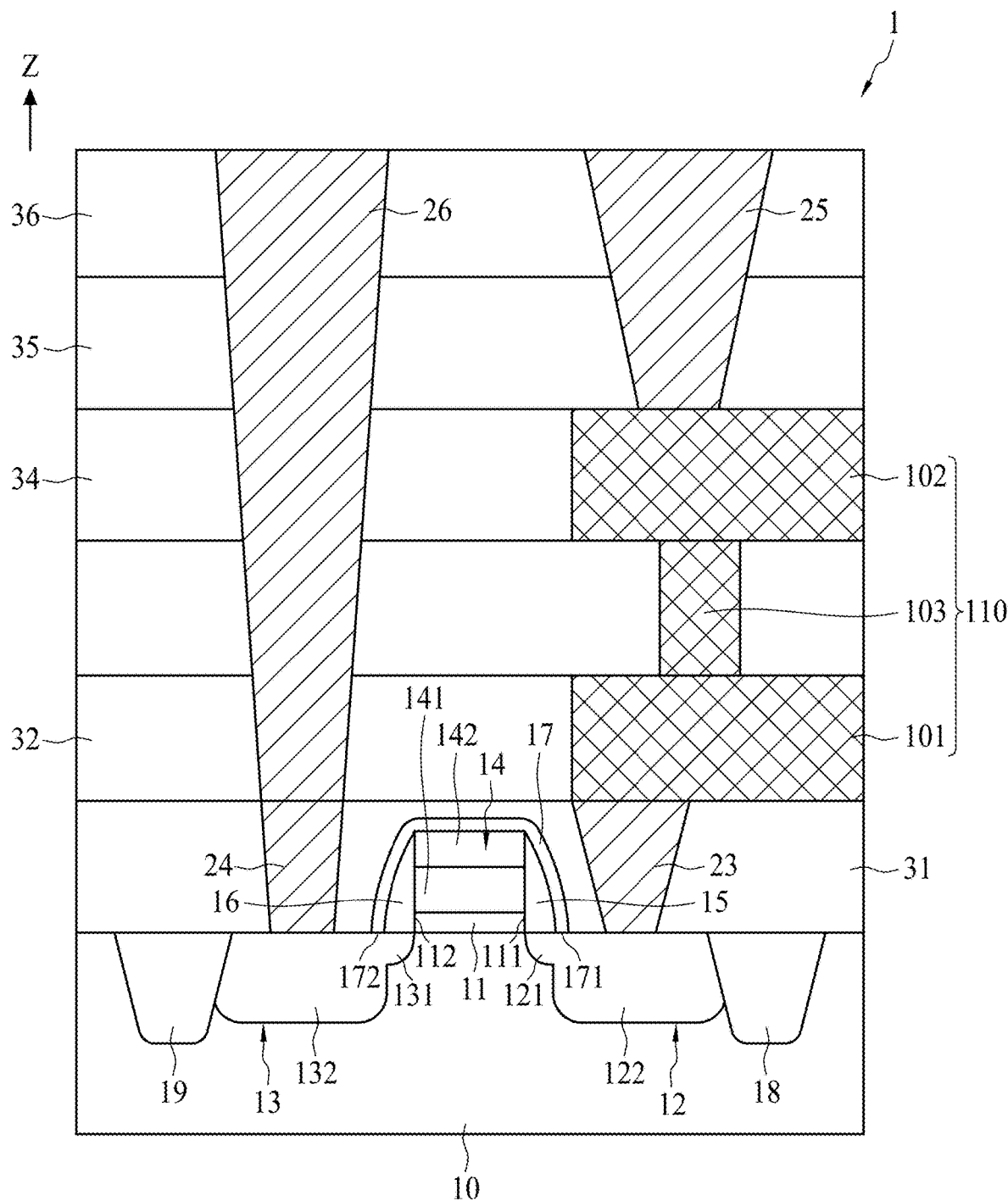
FIG. 1 to FIG. 3 illustrate, in schematic cross-sectional view and circuit diagram form, a semiconductor device in accordance with an embodiment of the present disclosure.

FIG. 1 illustrates, in schematic cross-sectional view, an exemplary semiconductor device in accordance with an embodiment of the present disclosure. The semiconductor device 1 includes, for example, a substrate 10, an insulating layer 11, a doped region 12, a doped region 13, a control terminal 14, a spacer 15, a spacer 16, a mask layer 17, an isolation structure 18, an isolation structure 19, a connecting plug 23, a connecting plug 24, a terminal 25, a terminal 26, an isolation layer 31, an isolation layer 32, an isolation layer 33, an isolation layer 34, an isolation layer 35, and a seal layer 36. The semiconductor device 1 further comprises a fuse device 110 including a first fuse head 101 connected to the connecting plug 23, a second fuse head 102 connected to the terminal 25, and a fuse area 103 positioned between the first fuse head 101 and the second fuse head 102.

The substrate 10 is formed of, for example, silicon (Si), doped silicon, silicon on insulator (SOI), silicon on sapphire (SOS), silicon germanium on insulator (SGOI), silicon carbide (SiC), germanium (Ge), gallium arsenide (GaAs), gallium phosphide (GaP), indium phosphide (InP) or any other IV-IV, III-V or II-VI semiconductor material. In the embodiment depicted, the substrate 10 is formed of p-type silicon, which is suitable for an n-type metal-oxide-semiconductor field-effect transistor (MOSFET). Alternatively, in another embodiment, the substrate 10 is formed of n-type silicon, for example.

The insulating layer 11 is disposed above the substrate 10. In the embodiment depicted, the insulating layer 11 is disposed on the substrate 10. The insulating layer 11 is formed of, for example, silicon oxide, silicon-oxy-nitride (SiON), barium strontium titanate (BST), lead zirconium titanate (PZT), titanium oxide ($TiO_2$), aluminum oxide ($Al_2O_3$), hafnium oxide ($HfO_2$), or zirconium oxide ($ZrO_2$). In the embodiment depicted, the insulating layer 11 is formed of silicon oxide. The insulating layer 11 includes two ends 111, 112. Alternatively, in another embodiment, the insulating layer 11 is formed of hafnium oxide, for example.

Note that the doped regions 12, 13 may be referred to as a first doped region and a second doped region. This includes embodiments where the doped region 12 is referred to as the first doped region and the doped region 13 is referred to as the second doped region, or vice versa.

The doped regions 12, 13 are formed in the substrate 10, respectively. In the embodiment depicted, the doped regions 12, 13 are respectively formed in the substrate 10 and are correspondingly adjacent to each end 111, 112 of the insulating layer 11. The doped region 12 is apart from the doped region 13 with the insulating layer 11 interposed therebetween.

The doped regions 12, 13 are doped by, for example, a dopant that is different from the substrate 10. In the embodiment depicted, the doped regions 12, 13 are doped by phosphorus (P). Alternatively, in another embodiment, the doped regions 12, 13 are doped by boron (B), for example.

The doped region 12 includes a lightly doped area 121 and a heavily doped area 122. The doped region 13 includes a lightly doped area 131 and a heavily doped area 132. The lightly doped areas 121, 131 of the doped regions 12, 13 are respectively formed in the substrate 10 and are correspondingly adjacent to each end 111, 112 of the insulating layer 11. The heavily doped area 122 of the doped region 12 is formed in the substrate 10 and is adjacent to the lightly doped area 121 of the doped region 12. The heavily doped area 132 of the doped region 13 is formed in the substrate 10 and is adjacent to the lightly doped area 131 of the doped region 13. The heavily doped areas 122, 132 of the doped regions 12, 13 respectively have a dopant concentration that is greater than a dopant concentration of the lightly doped areas 121, 131 of the doped regions 12, 13. In the embodiment depicted, the dopant concentration of the lightly doped areas 121, 131 of the doped regions 12, 13 is about $10^{13}/cm^2$ and the dopant concentration of the heavily doped areas 122, 132 of the doped regions 12, 13 is about $10^{15}/cm^2$. The lightly doped areas 121, 131 of the doped regions 12, 13 may alleviate the hot electron effect.

The control terminal 14 is disposed above the insulating layer 11. In the embodiment depicted, the control terminal 14 is disposed on the insulating layer 11 and is opposite to the substrate 10. The control terminal 14 is not opposite to the doped regions 12, 13. The control terminal 14 includes a doped layer 141 and a metal layer 142. The doped layer 141 is disposed on the insulating layer 11. The metal layer 142 is disposed on the doped layer 141 and is opposite to the insulating layer 11 with the doped layer 141 interposed therebetween.

The doped layer 141 is formed of, for example, polysilicon. In the embodiment depicted, the doped layer 141 is formed of polysilicon doped with phosphorus. The metal layer 142 is formed of, for example, metal silicide such as nickel silicide, platinum silicide, titanium silicide, molybdenum silicide, cobalt silicide, tantalum silicide, or tungsten silicide. In the embodiment depicted, the metal layer 142 is formed of tungsten silicide. Alternatively, in another embodiment, the doped layer 141 is formed of titanium nitride (TiN) and the metal layer 142 is formed of tantalum nitride (TaN), for example.

Note that the spacers 15, 16 may be referred to as a first spacer and second spacer. This includes embodiments in which the spacer 15 is referred to as the first spacer and the spacer 16 is referred to as the second spacer, or vice versa.

The spacers 15, 16 are respectively attached to side walls of the control terminal 14. The spacer 15 is opposite to the spacer 16 with the control terminal 14 interposed therebetween. Bottom surfaces of the spacers 15, 16 respectively contact the lightly doped areas 121, 131 of the doped regions 12, 13.

The spacers 15, 16 are formed of, for example, an insulating material such as silicon oxide or silicon nitride. In the embodiment depicted, the spacers 15, 16 are formed of silicon oxide. The spacers 15, 16 can be used to isolate the control terminal 14 and the doped regions 12, 13.

The mask layer 17 is disposed above the control terminal 14. In the embodiment depicted, the mask layer 17 is disposed on the metal layer 142 and the spacers 15, 16 and is opposite to the doped layer 141. The mask layer 17 covers the spacers 15, 16 and the control terminal 14. The mask layer 17 includes two ends 171, 172. The ends 171, 172 of the mask layer 17 respectively contact the doped regions 12, 13.

The mask layer 17 is formed of, for example, an insulating material such as silicon oxide or silicon nitride. In the embodiment depicted, the mask layer 17 is formed of silicon nitride.

The substrate 10, the insulating layer 11, the doped regions 12, 13, and the control terminal 14 together form an n-type MOSFET. The doped regions 12, 13 serve as a source and a drain of the n-type MOSFET, respectively. In the embodiment depicted, the doped region 13 serves as the source of the n-type MOSFET and the doped region 12 serves as the drain of the n-type MOSFET. The control terminal 14 serves as a gate of the n-type MOSFET. When a positive voltage is applied to the control terminal 14 (gate), a channel forms in the substrate 10 and free electrons in the doped region 13 (source) can pass through the substrate 10 by the channel to the doped region 12 (drain) to form a current while a voltage difference is present between the doped regions 12, 13. When the applied voltage is zero, no channel is formed in the substrate 10; hence, no current will form between the doped regions 12, 13. Accordingly, the control terminal 14 can serve as a switch to control the operation mode (on/off) of the n-type MOSFET by controlling the applied voltage. Alternatively, the n-type MOSFET may be part of a complementary metal-oxide-semiconductor field-effect transistor (CMOSFET).

Note that the isolation structures 18, 19 may be referred to as a first isolation structure and a second isolation structure. This includes embodiments in which the isolation structure 18 is referred to as the first isolation structure and the isolation structure 19 is referred to as the second isolation structure, or vice versa.

The isolation structures 18, 19 are respectively adjacent to the doped regions 12, 13. In the embodiment depicted, the isolation structures 18, 19 are respectively adjacent to the heavily doped areas 122, 132 of the doped regions 12, 13. The isolation structures 18, 19 are respectively opposite to the lightly doped areas 121, 131 of the doped regions 12, 13.

The isolation structures 18, 19 are formed of, for example, an insulating material such as silicon oxide or silicon nitride. In the embodiment depicted, the isolation structures 18, 19 are formed of silicon oxide.

Note that the first fuse head 101 and the second fuse head 102 may be referred to as a first conductive layer and a second conductive layer. This includes embodiments in which the first fuse head 101 is referred to as the first conductive layer and the second fuse head 102 is referred to as the second conductive layer, or vice versa. Furthermore, the connecting plugs 23, 24 may be referred to as a first connecting plug and a second connecting plug. This includes embodiments in which the connecting plug 23 is referred to as the first connecting plug and the connecting plug 24 is referred to as the second connecting plug, or vice versa.

The first fuse head 101 is disposed above the substrate 10 and electrically coupled to the n-type MOSFET. In the embodiment depicted, the first fuse head 101 is disposed above the substrate 10. Specifically, the first fuse head 101 is disposed on the isolation layer 31 and is electrically coupled to the doped region 12. The first fuse head 101 is electrically coupled to the heavily doped area 122 of the doped region 12 by the connecting plug 23. In the embodiment depicted, the connecting plug 23 penetrates the isolation layer 31 and connects the first fuse head 101 to the doped region 12.

The first fuse head 101 is formed of, for example, a doped polysilicon, a metal or alloy with good conductivity such as aluminum-silicon-copper alloy (Al—Si—Cu Alloy), aluminum (Al), gold (Au), silver (Ag), nickel (Ni), tungsten (W), or copper (Cu). In the embodiment depicted, the first fuse head 101 is formed of copper. However, selections of materials can be made as appropriate depending on requirements and are not particularly constrained.

The connecting plug 24 is coupled to the doped region 13. The connecting plug 24 is disposed on the substrate 10. In the embodiment depicted, the connecting plug 24 is coupled to the heavily doped area 132 of the doped region 13. The connecting plugs 23, 24 are formed of, for example, tungsten, copper, or aluminum. In the embodiment depicted, the connecting plugs 23, 24 are formed of tungsten.

Note that the isolation layers 31, 32, 33, 34, 35 may be referred to as the first isolation layer, the second isolation layer, the third isolation layer, etc. This includes embodiments in which the isolation layer 31 is referred to as the first isolation layer, the isolation layer 32 is referred to as the second isolation layer, and the isolation layer 33 is referred to as the third isolation layer, and so on, for example.

The isolation layer 31 is disposed above the substrate 10. In the embodiment depicted, the isolation layer 31 is disposed on the substrate 10 and encloses the mask layer 17 and the connecting plugs 23, 24. The isolation layer 31 is formed of, for example, phosphosilicate glass (PSG), borosilicate glass (BSG), borophosphosilicate glass (BPSG), or fluorinated silicate glass (FSG). In the embodiment depicted, the isolation layer 31 is formed of borophosphosilicate glass.

The isolation layer 32 is disposed above the substrate 10 and above the isolation layer 31. In the embodiment depicted, the isolation layer 32 is disposed on the isolation layer 31. The isolation layer 32 is disposed at the same level as the first fuse head 101 and encloses the first fuse head 101.

The isolation layer 33 is disposed above the substrate 10 and above the first fuse head 101. In the embodiment depicted, the isolation layer 33 is disposed on the first fuse head 101 and the isolation layer 32.

The second fuse head 102 is disposed above the substrate 10 and above the isolation layer 33 and at least partially overlaps the first fuse head 101. In the embodiment depicted, the second fuse head 102 is disposed on the isolation layer 33 and at least substantially overlaps the first fuse head 101. The first fuse head 101, the second fuse head 102, and the isolation layer 33 interposed therebetween together form a capacitor structure. Alternatively, in another embodiment, the configured capacitor structure is electrically coupled to a fin field-effect transistor, for example.

The second fuse head 102 can be formed of the same material as the first fuse head 101, but is not limited thereto. The second fuse head 102 is formed of, for example, a metal or alloy with good conductivity such as aluminum-silicon-copper alloy, aluminum, gold, silver, nickel, tungsten, or copper. In the embodiment depicted, the second fuse head 102 is formed of copper.

The isolation layer 34 is disposed above the substrate 10 and above the isolation layer 33. In the embodiment depicted, the isolation layer 34 is disposed on the isolation layer 33. The isolation layer 34 is disposed at the same level as the second fuse head 102 and encloses the second fuse head 102.

The isolation layer 35 is disposed above the substrate 10 and above the isolation layer 34. In the embodiment depicted, the isolation layer 35 is disposed on the isolation layer 34 and the second fuse head 102.

The isolation layers 32, 33, 34, 35 can be formed of, for example, the same material, but it are not limited thereto. The isolation layers 32, 33, 34, 35 are formed of, for example, a dielectric material such as silicon oxide, silicon nitride, fluorinated silicate glass, or porous silicon oxide. In the embodiment depicted, the isolation layers 32, 33, 34, 35 are formed of silicon oxide. Alternatively, in another embodiment, the isolation layer 33 is formed of dielectric material such as silicon-oxy-nitride, barium strontium titanate, lead zirconium titanate, titanium oxide, aluminum oxide, hafnium oxide, or zirconium oxide, for example. The capacitor structure having the isolation layer 33 formed of the aforementioned dielectric material may have a high capacitance.

The seal layer 36 is disposed above the substrate 10 and above the second fuse head 102. In the embodiment depicted, the seal layer 36 is disposed on the isolation layer 35. The seal layer 36 is formed of, for example, silicon oxide or silicon nitride. In the embodiment depicted, the seal layer 36 is formed of silicon nitride. The seal layer 36 preferably exerts a high vapor barrier in order to prevent moisture from entering from above.

Note that the terminals 25, 26 may be referred to as a first terminal and a second terminal. This includes embodiments in which the terminal 25 is referred to as the first terminal and the terminal 26 is referred to as the second terminal, or vice versa.

The terminal 25 is electrically connected to the second fuse head 102. In the embodiment depicted, the terminal 25 is formed to pass through the seal layer 36 and the isolation layer 35. The terminal 26 is electrically connected to the connecting plug 24. In the embodiment depicted, the terminal 26 is formed to pass through the seal layer 36 and the isolation layers 35, 34, 33, 32.

The terminals 25, 26 can be formed of the same material, but are not limited thereto. The terminals 25, 26 are formed of, for example, copper or aluminum. In the embodiment depicted, the terminals 25, 26 are formed of copper. The terminals 25, 26 can be connected to an external circuit for electrical readout and testing of the status (e.g., temperature, resistance) of the fuse 110 in the semiconductor device 1.

A plurality of barrier layers (not shown) are respectively disposed between the isolation layer 12 and the connecting plug 23, between the isolation layer 31 and the connecting plug 24, between the isolation layer 31 and the first fuse head 101, between the isolation layer 31 and isolation layer 32, between the isolation layer 32 and the first fuse head 101, between the isolation layer 32 and the terminal 26, between the isolation layer 32 and the isolation layer 33, between the isolation layer 33 and the terminal 26, between the isolation layer 33 and the second fuse head 102, between the isolation layer 33 and the isolation layer 34, between the isolation layer 34 and the second fuse head 102, between the isolation layer 34 and the terminal 26, between the isolation layer 34 and the isolation layer 35, between the isolation layer 35 and the second fuse head 102, between the isolation layer 35 and the terminal 25, between the isolation layer 35 and the terminal 26, and between the isolation layer 35 and the seal layer 36.

The plurality of barrier layers are formed of, for example, silicon nitride, titanium nitride, titanium-tungsten alloy, or tantalum nitride. In the embodiment depicted, the plurality of barrier layers are formed of silicon nitride. The plurality of barrier layers can improve the adhesion between aforementioned layers.

Figure 2:
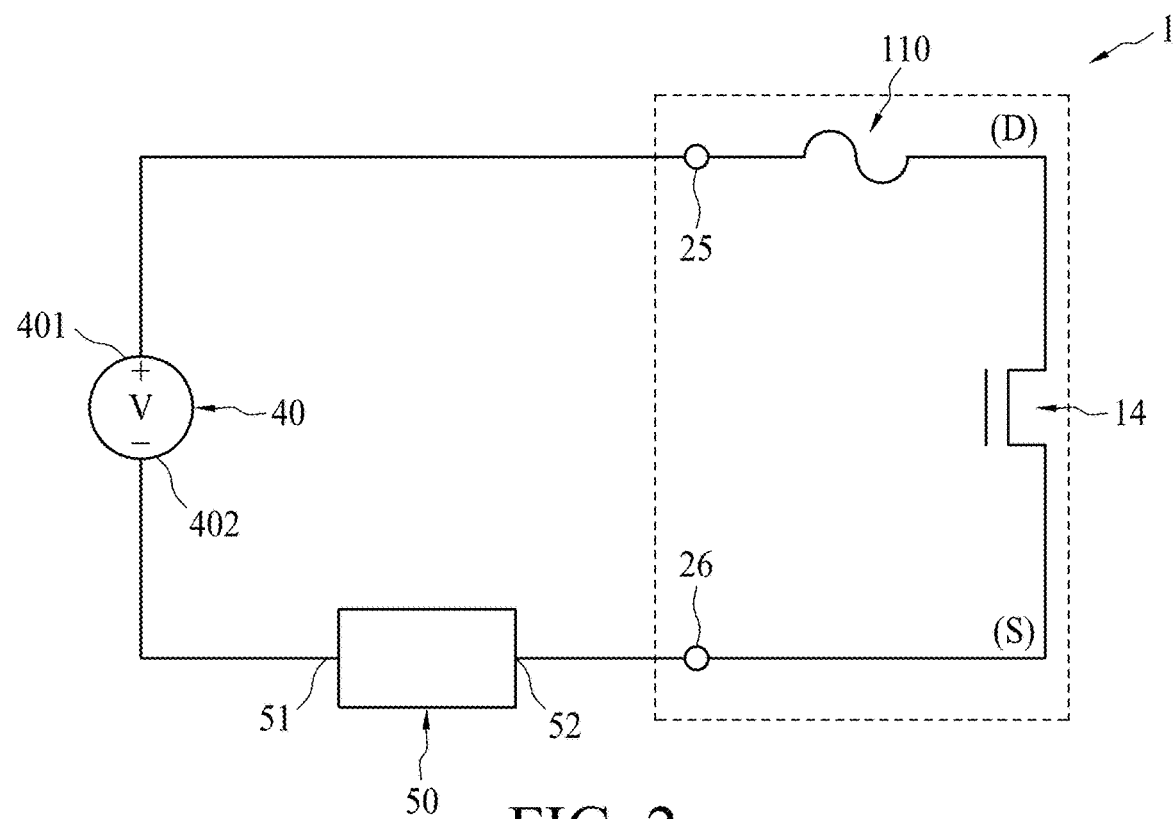

FIG. 2 illustrates, in schematic circuit diagram form, an exemplary fuse detecting circuit in accordance with the embodiment depicted. The fuse detecting circuit includes a test circuitry, a control circuitry and the semiconductor device 1. The test circuitry is electrically connected to the semiconductor device 1 through the terminals 25, 26 of the semiconductor device 1. The test circuitry includes a voltage source 40 and a signal detector 50. The signal detector 50 is, for example, a current detector or an impedance detector. In the embodiment depicted, the signal detector 50 is a current detector. The positive terminal 401 of the voltage source 40 is electrically connected to the terminal 25, and the negative terminal 402 of the voltage source 40 is electrically connected to a first terminal 51 of the signal detector 50. A second terminal 52 of the signal detector 50 is electrically connected to the terminal 26. The voltage source 40 can provide a predetermined voltage to the semiconductor device 1, wherein the predetermined voltage is less than the breakdown voltage of the capacitor structure of the semiconductor device 1. The control circuitry (not shown) is electrically connected to the metal layer 142 of the control terminal 14.

The control circuitry (not shown) includes a voltage source to provide a gate voltage to control the operation mode of the n-type MOSFET of the semiconductor device 1. When the provided gate voltage is positive, the channel between the doped regions 12, 13, or drain and source, is formed. The channel forms between the doped regions 12, 13, which means the n-type MOSFET is in On mode for detecting the status (e.g., temperature, resistance) of the fuse 110 in the semiconductor device 1.

When the provided gate voltage is positive and the predetermined voltage of the voltage source 40 is applied, if the fuse 110 is in connection state, the current can be measured by the signal detector 50. In contrast, if the fuse 110 is in non-connection state, no current will be measured.

However; when the provided gate voltage is zero or negative, no channel will form in the substrate 10 of the semiconductor device 1, and the n-type MOSFET is in Off mode, and therefore not capable of detecting the status of the fuse 110. The semiconductor device 1 can control the fuse detecting feature by controlling the provided gate voltage.

In another embodiment, for example, the voltage source 40 of the test circuitry and the voltage source of the control circuitry may be the same voltage source. Therefore, it is possible to control the operation mode of the semiconductor device 1 and provide the predetermined voltage at the same time. In another embodiment, for example, a ground voltage may apply to the negative terminal 402 of the voltage source 40 and the first terminal 51 of the signal detector 50.

Figure 3:
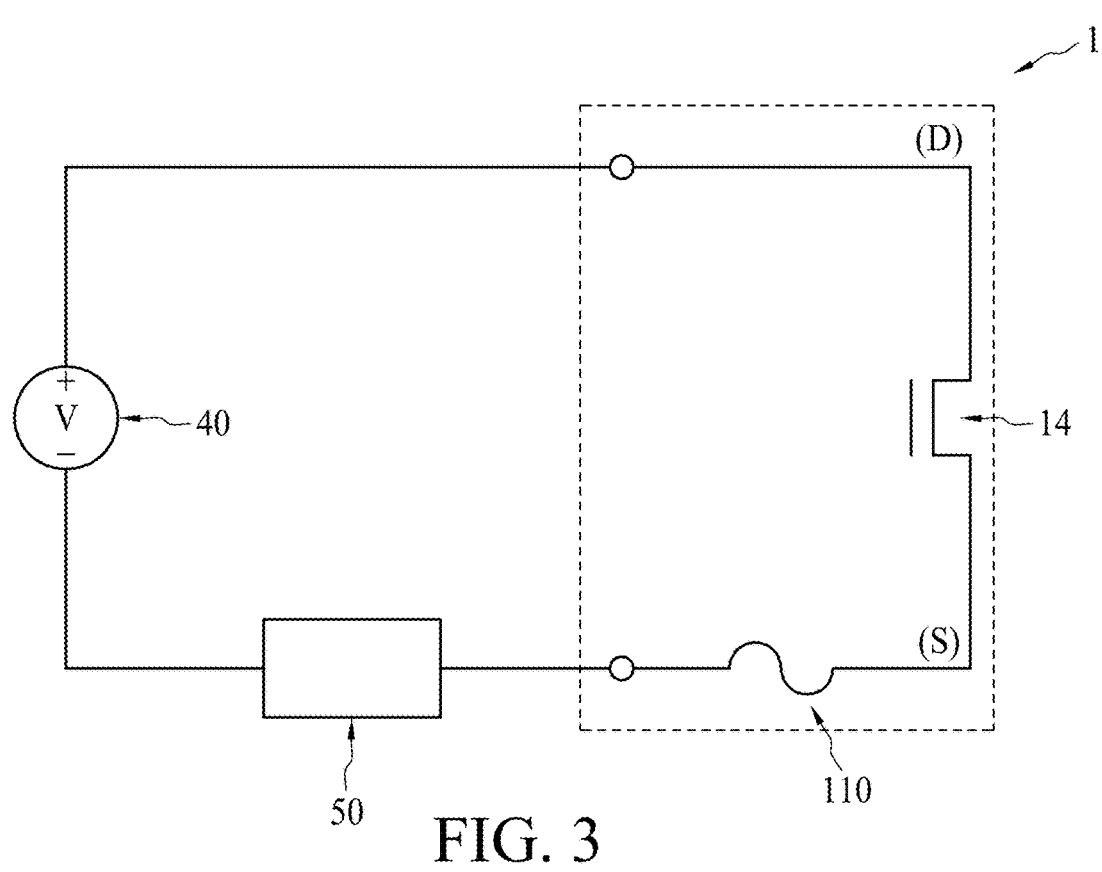

FIG. 3 illustrates, in schematic circuit diagram form, an exemplary fuse detecting circuit in accordance with another embodiment. In the embodiment, the fuse 110 of the semiconductor device 1 is formed in the source side and the method of detecting the status of the fuse 110 is the same as that illustrated in FIG. 2.

Figure 4:
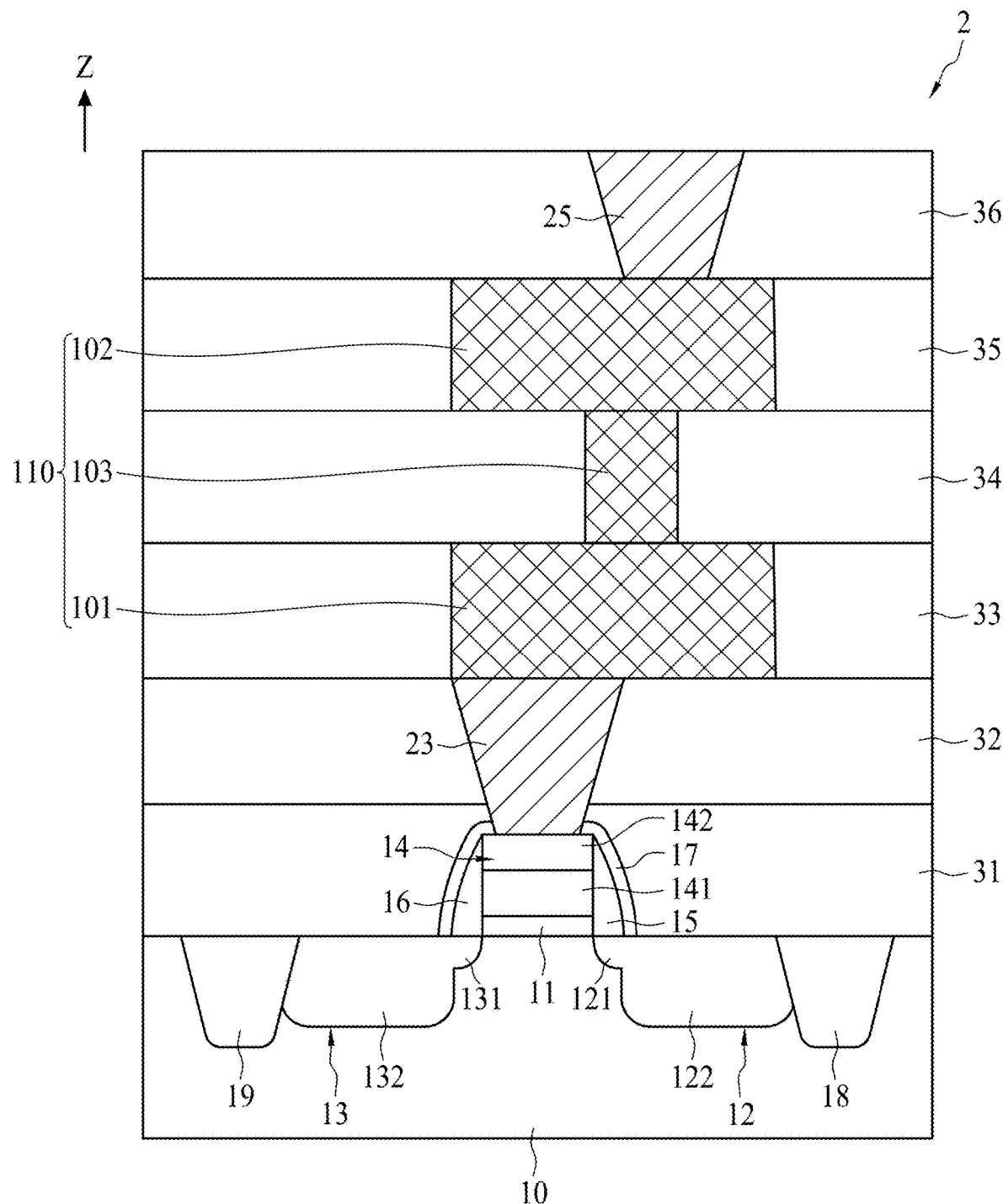
FIG. 4 and FIG. 5 illustrate, in schematic cross-sectional view and circuit diagram form, a semiconductor device in accordance with an embodiment of the present disclosure.

FIG. 4 is a cross-sectional view of a semiconductor device 2 in accordance with an embodiment of the present disclosure. In this embodiment, the first fuse head 101 is at the same level as the isolation layer 33 and is enclosed by the isolation layer 33. The first fuse head 101 is electrically coupled to the metal layer 142 of the control terminal 14 by the connecting plug 23. The connecting plug 23 penetrates the isolation layers 31, 32 and the mask layer 17 and electrically connects the metal layer 142 to the first fuse head 101. The second fuse head 102 is at the same level as the isolation layer 35 and is enclosed by the isolation layer 35. The second fuse head 102 is opposite to the first fuse head 101 with the isolation layer 34 interposed therebetween. The terminal 25 is formed to pass through the seal layer 36 and is electrically connected to the second fuse head 102. Two terminals (not shown) are electrically coupled to the doped regions 12, 13 and can be connected to an external circuit. Alternatively, in other embodiments, the isolation layer 34 can be formed of dielectric material such as silicon-oxynitride, barium strontium titanate, lead zirconium titanate, titanium oxide, aluminum oxide, hafnium oxide, or zirconium oxide, for example. The capacitor structure having the isolation layer 34 formed of the aforementioned dielectric material may have a high capacitance.

Figure 5:
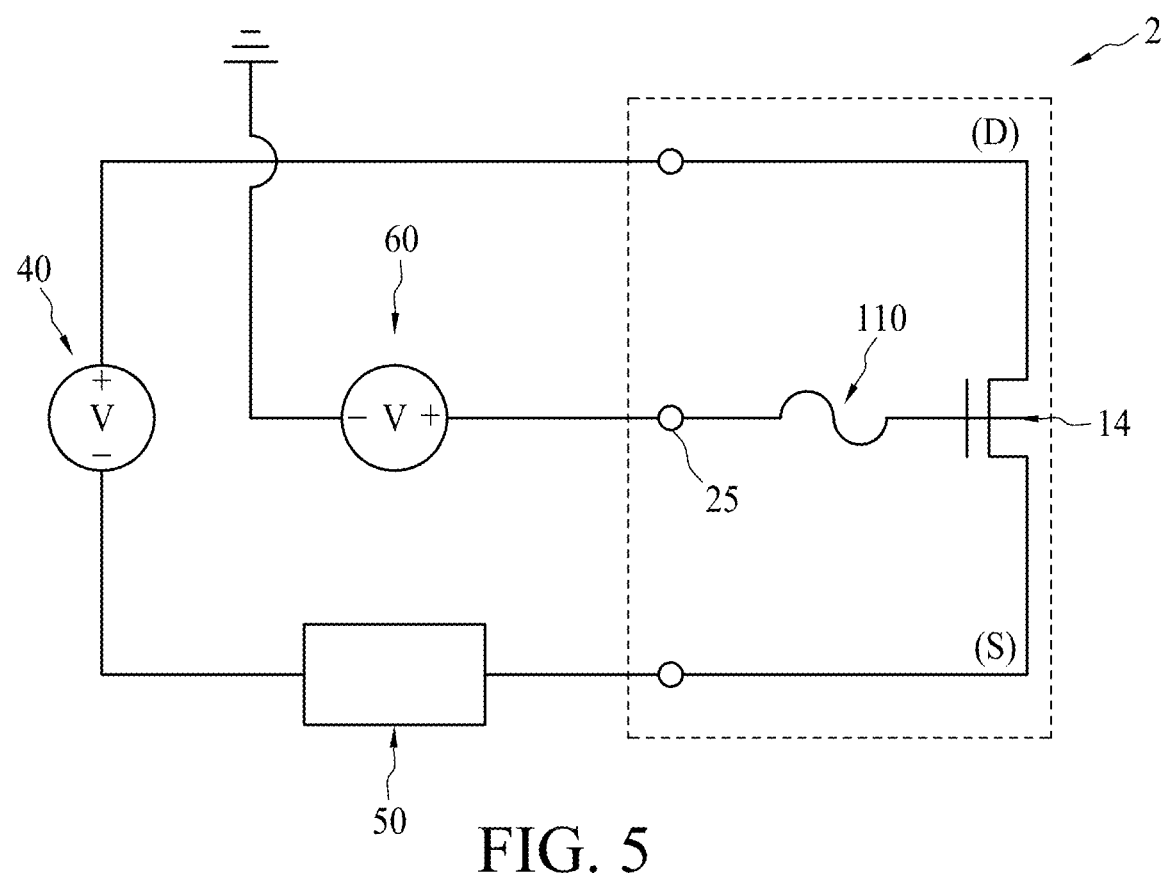

FIG. 5 illustrates, in schematic circuit diagram form, an exemplary fuse detecting circuit in accordance with the variation embodiment depicted. The voltage source 40 and the signal detector 50 of the test circuitry are electrically connected to the semiconductor device 2 through the terminals connected to the doped regions 12, 13. The voltage source 60 of the control circuitry is electrically connected to the terminal 25 of the semiconductor device 2.

When the provided gate voltage is positive and the predetermined voltage of the voltage source 60 is applied, if the fuse 110 is in connection state, the current can be measured by the signal detector 50. In contrast, if the fuse 110 is in non-connection state, no current will be measured. When the provided gate voltage of the voltage source 60 is positive and the predetermined voltage of the voltage source 40 is applied, if the fuse 110 is in connection state, the n-type MOSFET will be in On mode. Hence, the current can be measured by the signal detector 50. In contrast, if the fuse 110 is in non-connection state, the n-type MOSFET will be in Off mode due to the resistance of the capacitor structure of the semiconductor device 2. Accordingly, no current is measured by the signal detector 50. In another embodiment, for example, the voltage source 40 of the test circuitry and the voltage source 60 of the control circuitry may be the same voltage source.

The semiconductor device according to the present disclosure makes it possible to electrically and efficiently test for the status of the fuse, due to the capability for conducting testing. In addition, the semiconductor device according to the present disclosure makes it possible to electrically detect latent damages of the fuse, which are difficult to be detected by visual inspection.

The semiconductor device according to the present disclosure makes it possible to perform semiconductor device sorting with more consistency, more certainty, and greater ease.

Furthermore, the semiconductor device according to the present disclosure makes it possible to eliminate the visual inspection process. As a result, it is possible to reduce the number of inspectors and shorten the inspection process, thus greatly reducing cost.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor device, comprising:
a fuse including a first fuse head, a second fuse head, and a fuse area positioned between the first fuse head and the second fuse head;
a transistor electrically coupled to the first fuse head; and
a first voltage source, a second voltage source, and a signal detector; wherein the first voltage source is electrically and respectively coupled to the signal detector and a drain of the transistor, the signal detector is electrically coupled to a source of the transistor, and the second voltage source is electrically coupled to a gate of the transistor;
wherein the first fuse head, the second fuse head, the fuse area, and the transistor together form a detecting structure for detecting a status of the fuse;
wherein the first fuse head and the second fuse head at least partially overlap in a vertical direction.

2. The semiconductor device of claim 1, wherein the first fuse head is electrically coupled to a drain of the transistor.

3. The semiconductor device of claim 1, wherein the first fuse head is electrically coupled to a gate of the transistor.

4. The semiconductor device of claim 1, wherein the first fuse head is electrically coupled to a drain of the transistor.

5. A semiconductor device, comprising:
a substrate;
an insulating layer positioned above the substrate, wherein the insulating layer has two ends;
a first doped region formed in the substrate and positioned at one end of the two ends of the insulating layer;
a second doped region formed in the substrate and positioned at the other end of the two ends of the insulating layer, wherein the second doped region is opposite to the first doped region;
a control terminal positioned above the insulating layer;
a first fuse head positioned above the control terminal and electrically coupled to the control terminal;
a second fuse head positioned above the first fuse head;
a fuse area positioned between the first fuse head and the second fuse head; and
a first voltage source, a second voltage source, and a signal detector; wherein the first voltage source is electrically and respectively coupled to the signal detector and the first doped region, the signal detector is electrically coupled to the second doped region, and the second voltage source is electrically coupled to the second fuse head;
wherein the first fuse head and the second fuse head at least partially overlap in a vertical direction.

6. The semiconductor device of claim 5, wherein the control terminal comprises a doped layer and a metal layer, the doped layer is positioned on the insulating layer, and the metal layer is positioned on the doped layer.

* * * * *